United States Patent [19]
Ho

[11] Patent Number: 5,938,303
[45] Date of Patent: Aug. 17, 1999

[54] INTERFACE CARD HOLDER MOUNTING ARRANGEMENT

[76] Inventor: Hsin Chien Ho, 20F-1, 268 Sec. 1,Wen-Hua, Pan Chiao, Taiwan

[21] Appl. No.: 09/140,696

[22] Filed: Aug. 26, 1998

[51] Int. Cl.[6] .................................................. A47B 81/06
[52] U.S. Cl. ....................... 312/223.2; 361/683
[58] Field of Search .............. 312/223.1, 223.2, 312/293.3; 211/41.17; 361/683, 684, 801, 825, 829

[56] References Cited

U.S. PATENT DOCUMENTS

| | | | |
|---|---|---|---|
| 5,466,059 | 11/1995 | Lin ........................................ | 312/223.2 |
| 5,575,546 | 11/1996 | Radloff ................................. | 312/223.1 |
| 5,601,349 | 2/1997 | Holt ...................................... | 312/223.2 |
| 5,694,291 | 12/1997 | Feightner ............................. | 361/683 |
| 5,820,171 | 10/1998 | Albani et al. ........................ | 361/683 |
| 5,847,923 | 12/1998 | Lee ....................................... | 361/683 |

*Primary Examiner*—Peter M. Cuomo
*Assistant Examiner*—Jerry A. Anderson
*Attorney, Agent, or Firm*—Pro-Techtor International Services

[57] ABSTRACT

An interface card holder mounting arrangement includes an interface card holder attached to the vertical rear side wall of a casing for a computer mainframe, the interface card holder having hooks raised from a flange thereof extended out of an opening on the casing, a clamping plate having a tail end inserted into an insertion slot on a partition wall inside the casing and an angled clamping head clamped on the flange of the interface card holder, and a retainer plate which secures the interface card holder and the clamping plate to the vertical rear side wall of the casing, the retainer plate having one end hooked on the hooks of the interface card holder, a flange stopped at the angled clamping head against the flange of the interface card holder, and a flat tail fastened to a screw hole at the vertical rear side wall of the casing by a screw.

1 Claim, 2 Drawing Sheets

INTERFACE CARD HOLDER MOUNTING ARRANGEMENT

BACKGROUND OF THE INVENTION

The present invention relates to an interface card holder mounting arrangement, which enables an interface card holder to be quickly detachably installed in a casing for a computer mainframe for holding interface cards.

Different models of computers may have different designs for different functions. Further, a variety of expansion cards, interface cards, sound cards, etc., may be attached to a computer, so that different peripheral apparatus can be connected. Therefore, regular computers are commonly equipped with slots at the back side for the connection of a variety of cards. However, due to limited installation space, only a limited number of slots can be installed in the casing of a computer. In case an additional slot is needed, one of the existing slots must be removed from the casing of the computer for a replacement. However it is not easy to remove a slot from the casing for a replacement.

SUMMARY OF THE INVENTION

It the main object of the present invention to provide an interface card holder mounting arrangement which enables to the user to quickly detachably install an interface card holder in a casing for a computer. According to the present invention, the interface card holder mounting arrangement comprises an interface card holder attached to the vertical rear side wall of a casing for a computer mainframe, the interface card holder having hooks raised from a flange thereof extended out of an opening on the casing, a clamping plate having a tail end inserted into an insertion slot on a partition wall inside the casing and an angled clamping head clamped on the flange of the interface card holder, and a retainer plate which secures the interface card holder and the clamping plate to the vertical rear side wall of the casing, the retainer plate having one end hooked on the hooks of the interface card holder, a flange stopped at the angled clamping head against the flange of the interface card holder, and a flat tail fastened to a screw hole at the vertical rear side wall of the casing by a screw.

DETAILED DESCRIPTION OF THE PREFERRED EMBODIMENT

Figure 1:
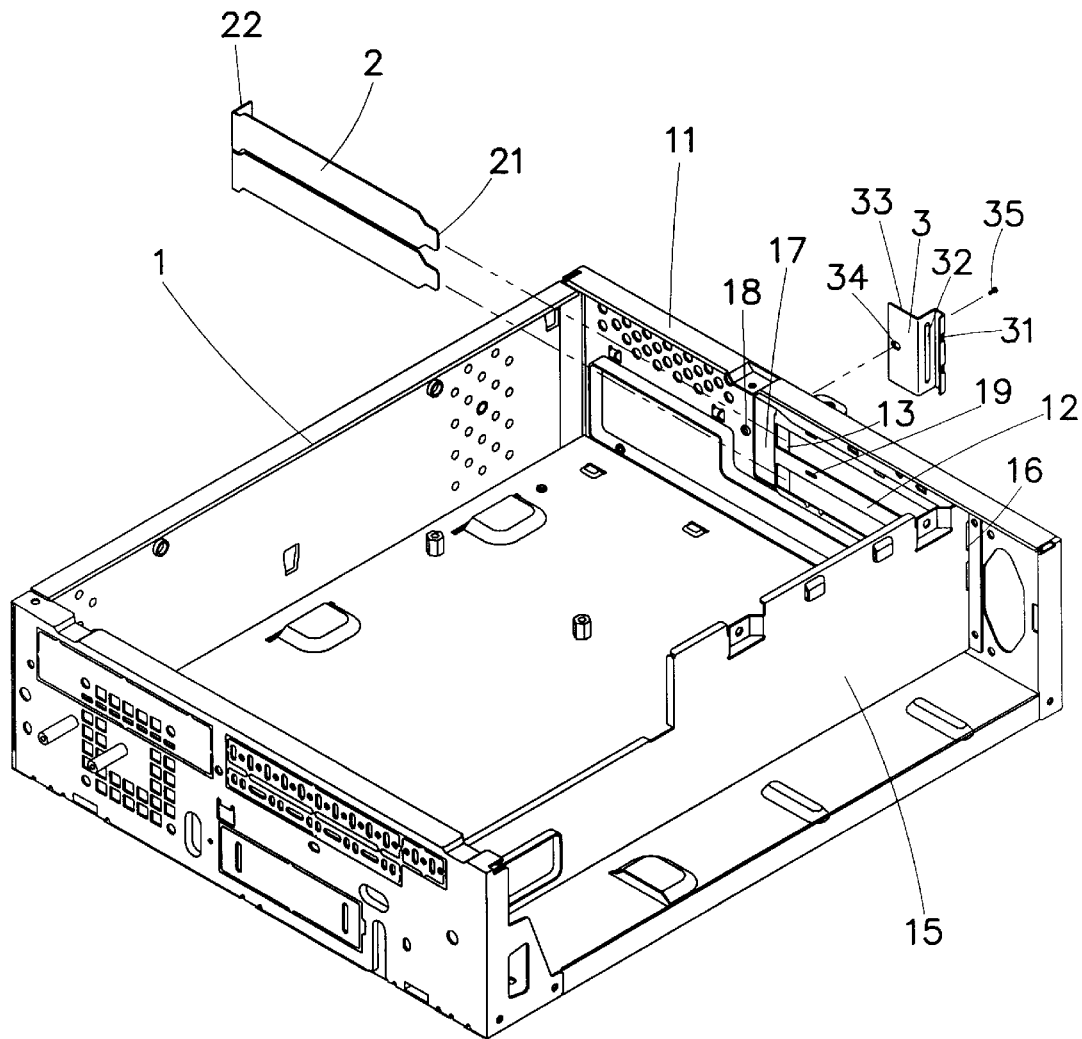
FIG. 1 is an exploded view of the present invention.
Figure 2:
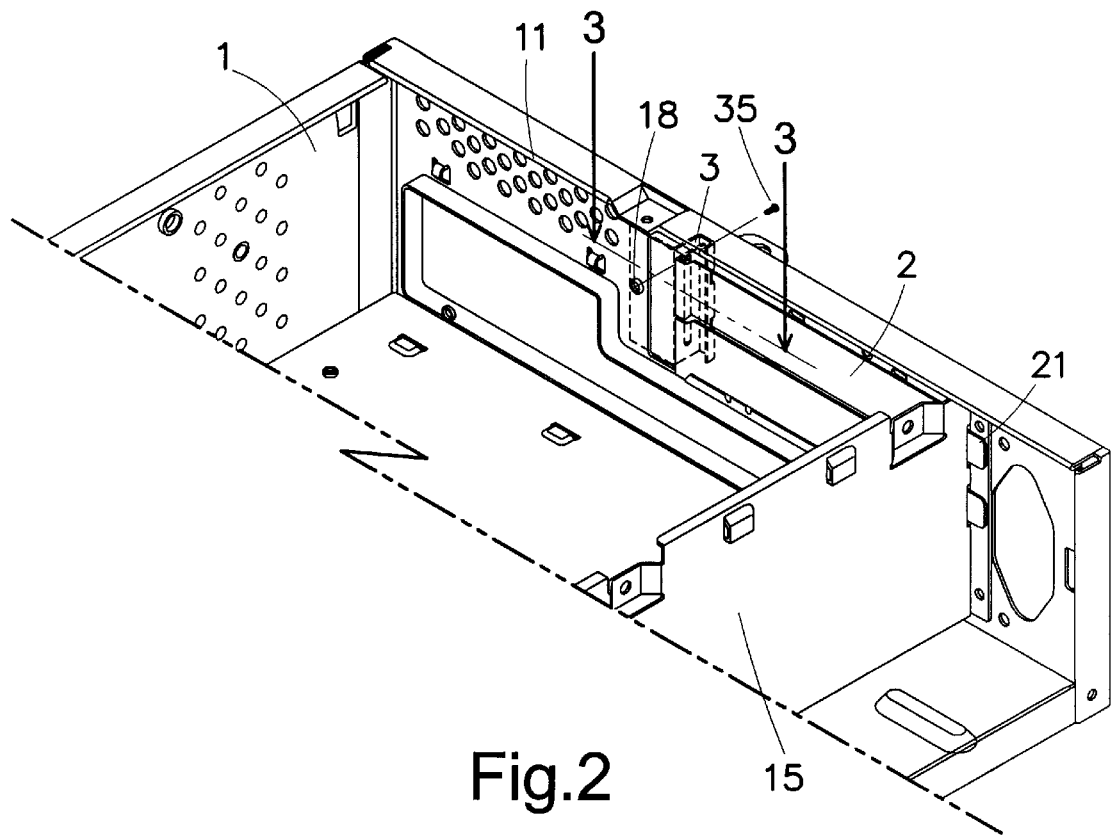
FIG. 2 is an installed view of the present invention.

Referring to FIGS. 1 and 2, the casing, referenced by 1, comprises a vertical rear side wall 11, and a partition wall 15 perpendicularly connected to the vertical rear side wall 11 at one side. The vertical rear side wall 11 has an opening 17 on the middle, and a screw hole 18 near the opening 17. The partition wall 15 has an insertion slot 16 near the vertical rear side wall 11. An interface card holder 12 is closely attached to the vertical rear side wall 11, and secured in place by a clamping plate 2 and a retainer plate 3. The interface card holder 12 comprises a flange 13 perpendicularly raised from one end thereof and inserted through the opening 17 on the vertical rear side wall 11 to the outside of the casing 1, and a set of hooks 14 respectively integral with the flange 13.

Figure 3:
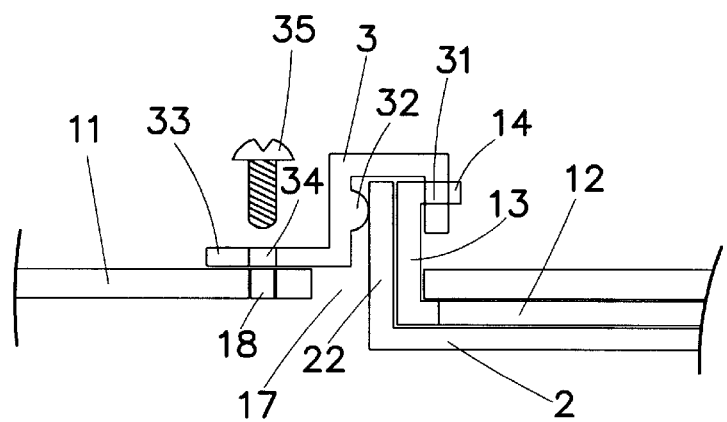
FIG. 3 is a top view in an enlarged scale of a part of FIG. 2.

Referring to FIG. 3 and FIGS. 1 and 2 again, the clamping plate 2 is closely attached to the interface card holder 12 at one side opposite to the vertical rear side wall 11 of the casing 1, having a tail end 21 inserted into the insertion slot 16 on the partition wall 15 and an angled clamping head 22 clamped on the flange 13 of the interface card holder 12. The retainer plate 3 comprises a set of hook holes 31 and a retaining flange 32 bilaterally provided at a substantially U-shaped body thereof, and a through hole 34 on a flat tail 33 thereof.

Referring to FIGS. from 1 through 3 again, after installation of the clamping plate 2, the U-shaped body of the retainer plate 3 is closely attached to the flange 13 of the interface card holder 12 and the angled clamping head 22 of the clamping plate 2, permitting the hook holes 31 to be respectively engaged with the hooks 14 and the retaining flange 32 stopped at the angled clamping head 22 against the flange 13 of the interface card holder 12, and then a screw 35 is inserted through the through hole 34 on the flat tail 33 of the retainer plate 3 and threaded into the screw hole 18 on the vertical rear side wall 11 of the casing 1 to fix the retainer plate 3 in place, and therefore the clamping plate 2 the interface card holder 12 are firmly secured to the vertical rear side wall 11 of the casing 1. Further, the interface card holder 12 has a raised portion 19 for positive positioning with the clamping plate 2.

What the invention claimed is:

1. An interface card holder mounting arrangement comprising:

a casing for a computer mainframe, said casing comprising a vertical rear side wall, and a partition wall perpendicularly connected to said vertical rear side wall at one side, said vertical rear side wall having an opening on the middle and at least one screw hole near said opening, said partition wall having an insertion slot near said vertical rear side wall;

an interface card holder attached to said vertical rear side wall inside said casing, said interface card holder comprising a flange perpendicularly raised from one end thereof and extended out of said casing through said opening and a set of hooks respectively integral with the flange;

a clamping plate closely attached to said interface card holder at one side opposite to the vertical rear side wall of said casing, said clamping plate having a tail end inserted into the insertion slot on said partition wall and an angled clamping head clamped on the flange of said interface card holder;

a retainer plate fastened to the vertical rear side wall of said casing and the hooks of said interface card holder to secure said clamping plate and said interface card holder together, said retainer plate comprising a set of hook holes engaged with the hooks of said interface card holder, a retaining flange stopped at the angled clamping head of said clamping plate against the flange of said interface card holder, and at least one through hole respectively connected to the at least one screw hole on the vertical rear side wall of said casing by a respective screw.

* * * * *